(12) United States Patent
Ye

(10) Patent No.: US 11,526,231 B2
(45) Date of Patent: Dec. 13, 2022

(54) TOUCH ROUTING LINES FOR SELF-CAPACITANCE TOUCH DISPLAY SCREEN AND DISPLAY DEVICE THEREOF

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/261,613

(22) PCT Filed: Nov. 18, 2020

(86) PCT No.: PCT/CN2020/129685
§ 371 (c)(1),
(2) Date: Jan. 20, 2021

(87) PCT Pub. No.: WO2022/062137
PCT Pub. Date: Mar. 31, 2022

(65) Prior Publication Data
US 2022/0197417 A1   Jun. 23, 2022

(30) Foreign Application Priority Data

Sep. 24, 2020   (CN) .......................... 202011014740.2

(51) Int. Cl.
G06F 3/041   (2006.01)
G06F 3/044   (2006.01)
H01L 27/32   (2006.01)

(52) U.S. Cl.
CPC ........ G06F 3/04164 (2019.05); G06F 3/0412 (2013.01); G06F 3/0443 (2019.05);
(Continued)

(58) Field of Classification Search
CPC .... G06F 3/0412; G06F 3/0443; G06F 3/0446; G06F 3/0448; G06F 3/044; G06F 3/0416;
(Continued)

(56) References Cited

U.S. PATENT DOCUMENTS

2014/0204290 A1*   7/2014   Chen ..................... G06F 3/0443
349/12
2014/0362032 A1*   12/2014   Mo ....................... G06F 3/0443
345/174

(Continued)

FOREIGN PATENT DOCUMENTS

CN   103279248 A   9/2013
CN   103926729 A   7/2014

(Continued)

*Primary Examiner* — Darlene M Ritchie
(74) *Attorney, Agent, or Firm* — The Roy Gross Law Firm, LLC; Roy Gross

(57) ABSTRACT

A touch display screen and a display device thereof are provided. By extending a first conductive line to a first side and a second conductive line to a second side, the first conductive line and the second conductive line corresponding to a first self-capacitance electrode and a second self-capacitance electrode in a touch module can be changed from a traditional vertical arrangement to a horizontal arrangement. Meanwhile, conductive lines on two sides are led out from opposite sides, thereby reducing a blind region of a touch screen and enhancing touch performance of the touch screen.

18 Claims, 7 Drawing Sheets

(52) U.S. Cl.
CPC ........ *G06F 3/0446* (2019.05); *H01L 27/3276* (2013.01); *G06F 3/0448* (2019.05); *H01L 27/323* (2013.01)

(58) Field of Classification Search
CPC ............. G06F 3/04164; H01L 27/3276; H01L 27/323
See application file for complete search history.

(56) References Cited

U.S. PATENT DOCUMENTS

| | | | | |
|---|---|---|---|---|
| 2015/0145821 | A1* | 5/2015 | Kim | G06F 3/0412 345/174 |
| 2016/0048233 | A1* | 2/2016 | Wang | G06F 3/0448 345/174 |
| 2016/0357337 | A1* | 12/2016 | Li | G02F 1/13338 |
| 2016/0378240 | A1* | 12/2016 | Li | G06F 3/04164 345/174 |
| 2017/0038899 | A1* | 2/2017 | Liu | G06F 3/0412 |

FOREIGN PATENT DOCUMENTS

| | | |
|---|---|---|
| CN | 104407758 A | 3/2015 |
| CN | 104615323 A | 5/2015 |

* cited by examiner

TOUCH ROUTING LINES FOR SELF-CAPACITANCE TOUCH DISPLAY SCREEN AND DISPLAY DEVICE THEREOF

CROSS REFERENCE TO RELATED APPLICATIONS

This application is a National Phase of PCT Patent Application No. PCT/CN2020/129685 having International filing date of Nov. 18, 2020, which claims the benefit of priority of Chinese Application No. 202011014740.2 filed Sep. 24, 2020. The contents of the above applications are all incorporated by reference as if fully set forth herein in their entirety.

FIELD OF INVENTION

The present invention relates to the field of display technologies, and in particular, to a touch display screen and a display device thereof.

BACKGROUND OF INVENTION

With a rapid development of display technologies, touch screens have gradually spread throughout people's lives. The touch screens can be divided into external touch screens that integrate touch modules and protective glasses outside display panels, and embedded touch screens that integrate the touch modules and the display panels. The embedded touch screens comprise overlay touch screens and in-cell touch screens. The overlay touch screens dispose the touch modules on an opposite side of the display panels away from array substrates. The in-cell touch screens, for example, dispose the touch modules on a side of opposite substrates of the display panels facing the array substrates.

At present, most touch screens are capacitive touch screens, which can be divided into touch screens using a mutual capacitance principle and a self-capacitance principle. For touch screens using the self-capacitance principle, due to their high touch sensing accuracy and signal-to-noise ratio, compared to the touch screens using the mutual capacitance principle, they are more suitable for the in-cell touch screens, and therefore have gradually become a new research focus.

Structures of the touch screens using the self-capacitance principle usually comprise a plurality of self-capacitance electrodes disposed in a same layer and insulated from each other. Each self-capacitance electrode is connected to a touch detection chip through a wire. When a human body does not touch a screen, a capacitance of each self-capacitance electrode is a fixed value. When the human body touches the screen, the capacitance of the self-capacitance electrode corresponding to a touch position is a fixed value superimposed on a human body capacitance. The touch detection chip can determine the touch position by detecting a change in a capacitance value of each self-capacitance electrode.

Since the human body capacitance can act on all self-capacitances, compared to the human body capacitance which can only act on a projected capacitance in the mutual capacitance, an amount of touch change caused by the human body touching the screen will be greater than a touch screen made by the mutual capacitance principle. Therefore, compared with the mutual capacitance touch screen, it can effectively improve a signal-to-noise ratio of touch, thereby improving an accuracy of touch sensing.

Technical Problem

In current self-capacitance touch design, in order to simplify a number of layers, conductive lines in lead-out lines and self-capacitance electrodes are generally disposed in a same layer. More conductive lines will cause a touch blind region to be larger. The touch blind region refers to a region where traces are concentrated in a touch screen. Signals in the touch blind region is relatively disordered, so it is called the touch blind region, that is, touch performance in the region cannot be guaranteed.

Technical Solution

The present invention provides a touch display screen and a display device thereof, aiming to solve a problem of reducing a touch blind region in a touch screen and ensuring touch performance.

In one aspect, the present invention provides a touch display screen comprising a touch module, wherein the touch module comprises a plurality of rows of electrode assemblies disposed side by side, and a first side and a second side disposed opposite to each other, wherein at least one row of the electrode assemblies comprises a first sub-electrode group and a second sub-electrode group distributed in sequence along a direction from the first side to the second side, wherein the first sub-electrode group comprises a plurality of first self-capacitance electrodes and a plurality of first conductive lines electrically connected to the plurality of first self-capacitance electrodes in a one-to-one correspondence, and the first conductive lines extend to the first side, wherein the second sub-electrode group comprises a plurality of second self-capacitance electrodes and a plurality of second conductive lines electrically connected to the plurality of second self-capacitance electrodes in a one-to-one correspondence, and the second conductive lines extend to the second side.

In a possible implementation of the present invention, the touch module further comprises a third side located between the first side and the second side;

a row of electrode assemblies close to the third side and located at an edge comprises a third sub-electrode group and a fourth sub-electrode group distributed in sequence along the direction from the first side to the second side, wherein the third sub-electrode group comprises a plurality of third self-capacitance electrodes and a plurality of third conductive lines electrically connected to the plurality of third self-capacitance electrodes in a one-to-one correspondence; wherein the fourth sub-electrode group comprises a plurality of fourth self-capacitance electrodes and a plurality of fourth conductive lines electrically connected to the plurality of fourth self-capacitance electrodes in a one-to-one correspondence; and the third conductive lines extend to the third side, and/or the fourth conductive lines extend to the third side.

In a possible implementation of the present invention, the touch module further comprises a fourth side opposite to the third side and located between the first side and the second side;

a row of electrode assemblies close to the fourth side and located at the edge comprises a fifth sub-electrode group and a sixth sub-electrode group distributed in sequence along the direction from the first side to the second side, wherein the fifth sub-electrode group comprises a plurality of fifth self-capacitance electrodes and a plurality of fifth conductive lines electrically connected to the plurality of fifth self-capacitance electrodes in a one-to-one correspondence;

wherein the sixth sub-electrode group comprises a plurality of sixth self-capacitance electrodes and a plurality of sixth conductive lines electrically connected to the plurality of sixth self-capacitance electrodes in a one-to-one correspondence; and the fifth conductive lines extend to the fourth side, and/or the sixth conductive lines extend to the fourth side.

In a possible implementation of the present invention, a maximum distance between the first side and the second side is not greater than a maximum distance between the third side and the fourth side.

In a possible implementation of the present invention, at least two of the first conductive lines are respectively disposed on two sides of the first sub-electrode group, one of the at least two first conductive lines is connected to an upper end of the first self-capacitance electrode, the other first conductive line is connected to a lower end of the first self-capacitance electrode, and different first conductive lines are connected to different first self-capacitance electrodes.

In a possible implementation of the present invention, at least two of the second conductive lines are respectively disposed on two sides of the second sub-electrode group, one of the at least two second conductive lines is connected to an upper end of the second self-capacitance electrode, the other second conductive line is connected to a lower end of the second self-capacitance electrode, and different second conductive lines are connected to different second self-capacitance electrodes.

In a possible implementation of the present invention, the first self-capacitance electrode and the second self-capacitance electrode are in a same film layer and are independent from each other.

In a possible implementation of the present invention, the first conductive line and the first self-capacitance electrode are provided in a same layer, and/or the second conductive line and the second self-capacitance electrode are provided in a same layer.

In a possible implementation of the present invention, further comprises a display module, wherein the display module comprises:

a base substrate;

an array substrate disposed on the base substrate;

a light-emitting device layer disposed on the array substrate; and an encapsulation layer disposed on the light-emitting device layer;

wherein the touch module is disposed on the encapsulation layer.

In a possible implementation of the present invention, the light-emitting device layer comprises a light-emitting layer, and the light-emitting layer comprises a plurality of sub-pixels;

at least two of the first conductive lines are disposed in an interval between two adjacent sub-pixels in a same row, and/or at least two of the second conductive lines are disposed in the interval between two adjacent sub-pixels in the same row.

In a possible implementation of the present invention, further comprises peripheral wires located at a frame of the touch display screen and connected to each of the first conductive lines and the second conductive lines in a one-to-one correspondence.

On the other aspect, the present invention provides a display device comprising a polarizer and a touch display screen, wherein the touch display screen comprises a touch module, the touch module comprises a plurality of rows of electrode assemblies disposed side by side, and a first side and a second side disposed opposite to each other, wherein at least one row of the electrode assemblies comprises a first sub-electrode group and a second sub-electrode group distributed in sequence along a direction from the first side to the second side, wherein the first sub-electrode group comprises a plurality of first self-capacitance electrodes and a plurality of first conductive lines electrically connected to the plurality of first self-capacitance electrodes in a one-to-one correspondence, and the first conductive lines extend to the first side, wherein the second sub-electrode group comprises a plurality of second self-capacitance electrodes and a plurality of second conductive lines electrically connected to the plurality of second self-capacitance electrodes in a one-to-one correspondence, and the second conductive lines extend to the second side; wherein the polarizer is disposed on the touch module.

In a possible implementation of the present invention, the touch module further comprises a third side located between the first side and the second side;

a row of electrode assemblies close to the third side and located at an edge comprises a third sub-electrode group and a fourth sub-electrode group distributed in sequence along the direction from the first side to the second side, wherein the third sub-electrode group comprises a plurality of third self-capacitance electrodes and a plurality of third conductive lines electrically connected to the plurality of third self-capacitance electrodes in a one-to-one correspondence; wherein the fourth sub-electrode group comprises a plurality of fourth self-capacitance electrodes and a plurality of fourth conductive lines electrically connected to the plurality of fourth self-capacitance electrodes in a one-to-one correspondence; and the third conductive lines extend to the third side, and/or the fourth conductive lines extend to the third side.

In a possible implementation of the present invention, the touch module further comprises a fourth side opposite to the third side and located between the first side and the second side;

a row of electrode assemblies close to the fourth side and located at the edge comprises a fifth sub-electrode group and a sixth sub-electrode group distributed in sequence along the direction from the first side to the second side, wherein the fifth sub-electrode group comprises a plurality of fifth self-capacitance electrodes and a plurality of fifth conductive lines electrically connected to the plurality of fifth self-capacitance electrodes in a one-to-one correspondence; wherein the sixth sub-electrode group comprises a plurality of sixth self-capacitance electrodes and a plurality of sixth conductive lines electrically connected to the plurality of sixth self-capacitance electrodes in a one-to-one correspondence; and the fifth conductive lines extend to the fourth side, and/or the sixth conductive lines extend to the fourth side.

In a possible implementation of the present invention, a maximum distance between the first side and the second side is not greater than a maximum distance between the third side and the fourth side.

In a possible implementation of the present invention, at least two of the first conductive lines are respectively disposed on two sides of the first sub-electrode group, one of the at least two first conductive lines is connected to an upper end of the first self-capacitance electrode, the other first conductive line is connected to a lower end of the first self-capacitance electrode, and different first conductive lines are connected to different first self-capacitance electrodes.

In a possible implementation of the present invention, at least two of the second conductive lines are respectively disposed on two sides of the second sub-electrode group, one of the at least two second conductive lines is connected to an upper end of the second self-capacitance electrode, the other second conductive line is connected to a lower end of the second self-capacitance electrode, and different second conductive lines are connected to different second self-capacitance electrodes.

In a possible implementation of the present invention, the first self-capacitance electrode and the second self-capacitance electrode are in a same film layer and are independent from each other.

In a possible implementation of the present invention, the first conductive line and the first self-capacitance electrode are provided in a same layer, and/or the second conductive line and the second self-capacitance electrode are provided in a same layer.

In a possible implementation of the present invention, further comprises a display module, wherein the display module comprises:

a base substrate;

an array substrate disposed on the base substrate;

a light-emitting device layer disposed on the array substrate; and an encapsulation layer disposed on the light-emitting device layer;

wherein the touch module is disposed on the encapsulation layer

In a possible implementation of the present invention, the display device further comprises a touch display integrated chip, wherein the touch display integrated chip is connected to the first self-capacitance electrode and the second self-capacitance electrode in the touch module; and/or the touch display integrated chip is electrically connected to the display module.

Beneficial Effect

A touch display screen in the present invention comprises a touch module. The touch module comprises a plurality of rows of electrode assemblies disposed side by side, and a first side and a second side disposed opposite to each other. Wherein, at least one row of the electrode assemblies comprises a first sub-electrode group and a second sub-electrode group distributed in sequence along a direction from the first side to the second side. The first sub-electrode group comprises a plurality of first self-capacitance electrodes and a plurality of first conductive lines electrically connected to the plurality of first self-capacitance electrodes in a one-to-one correspondence. The second sub-electrode group comprises a plurality of second self-capacitance electrodes and a plurality of second conductive lines electrically connected to the plurality of second self-capacitance electrodes in a one-to-one correspondence. By extending the first conductive lines to the first side and the second conductive lines to the second side, the first conductive lines and the second conductive lines corresponding to the first self-capacitance electrode and the second self-capacitance electrode in the touch module can be changed from a traditional vertical arrangement to a horizontal arrangement. Meanwhile, conductive lines on two sides are led out from opposite sides, which can increase a common area of the first conductive lines and the second conductive lines, reduce an overall area occupied by the first conductive lines and the second conductive lines, thereby reducing a blind region of a touch screen and enhancing touch performance of the touch display screen.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The following will clearly and completely describe the technical solutions in the embodiments of the present invention with reference to the drawings in the embodiments of the present invention. Obviously, the described embodiments are only a part of the embodiments of the present invention, rather than all the embodiments. Based on the embodiments in the present invention, all other embodiments obtained by those skilled in the art without creative work are within the protection scope of the present invention.

Embodiments of the present invention provide a touch display screen and a display device thereof. The touch display screen comprises a touch module, wherein the touch module comprises a plurality of rows of electrode assemblies disposed side by side, and a first side and a second side disposed opposite to each other, wherein at least one row of the electrode assemblies comprises a first sub-electrode group and a second sub-electrode group distributed in sequence along a direction from the first side to the second side, wherein the first sub-electrode group comprises a plurality of first self-capacitance electrodes and a plurality of first conductive lines electrically connected to the plurality of first self-capacitance electrodes in a one-to-one correspondence, and the first conductive lines extend to the first side, wherein the second sub-electrode group comprises a plurality of second self-capacitance electrodes and a plurality of second conductive lines electrically connected to the plurality of second self-capacitance electrodes in a one-toone correspondence, and the second conductive lines extend to the second side. Detailed descriptions are given below.

Figure 1:
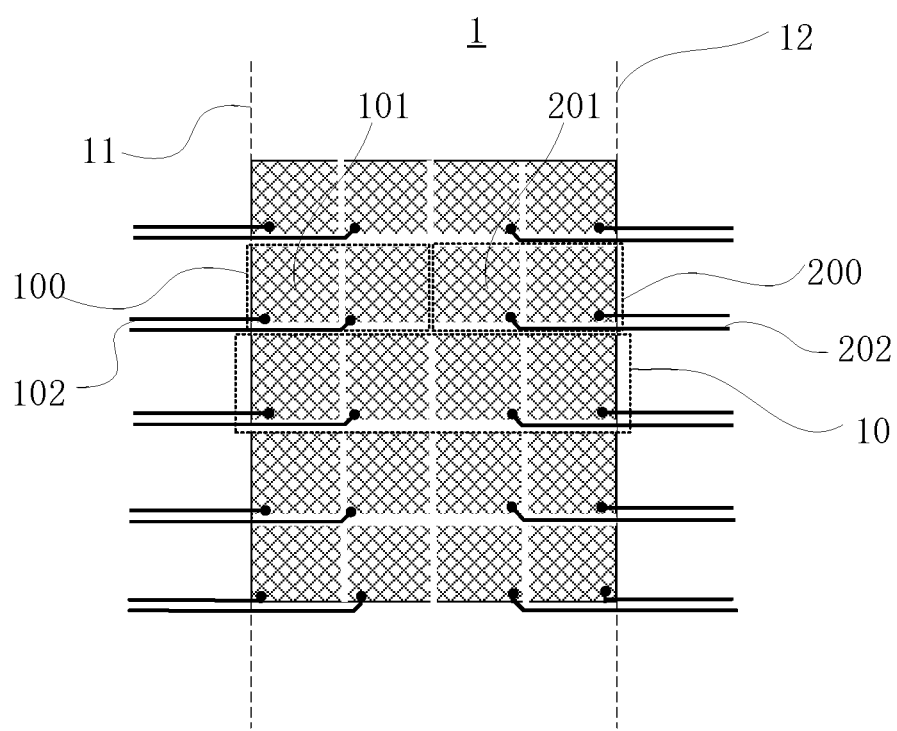
FIG. 1 is a schematic structural view of an embodiment of a touch module provided by an embodiment of the present invention.
Figure 2:
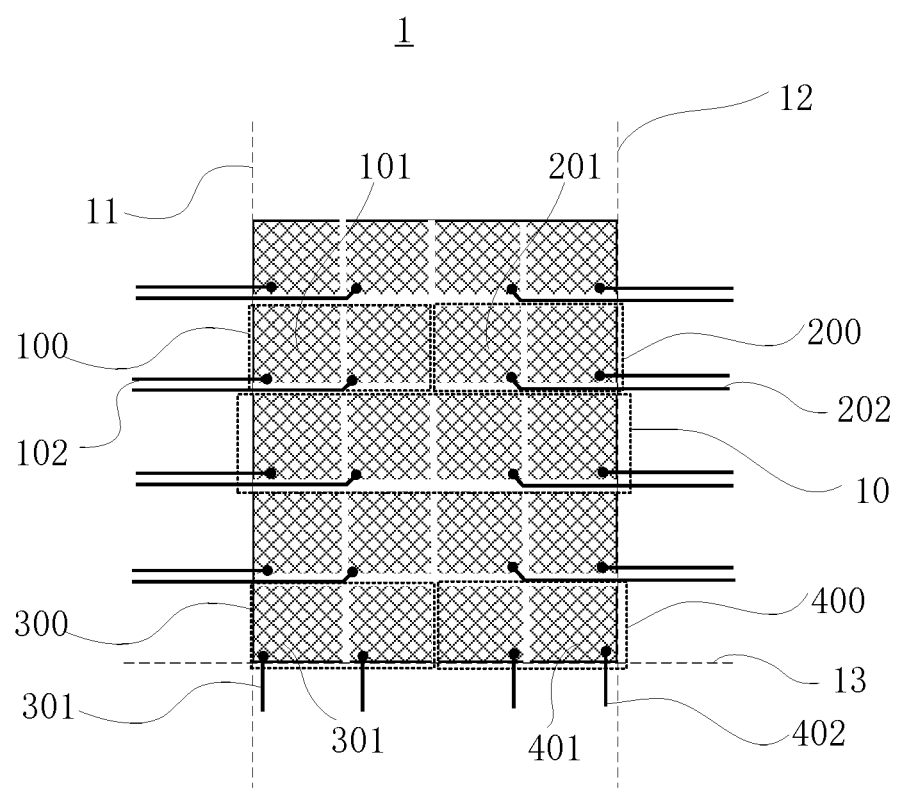
FIG. 2 is a schematic structural view of another embodiment of the touch module provided by the embodiment of the present invention.
Figure 3:
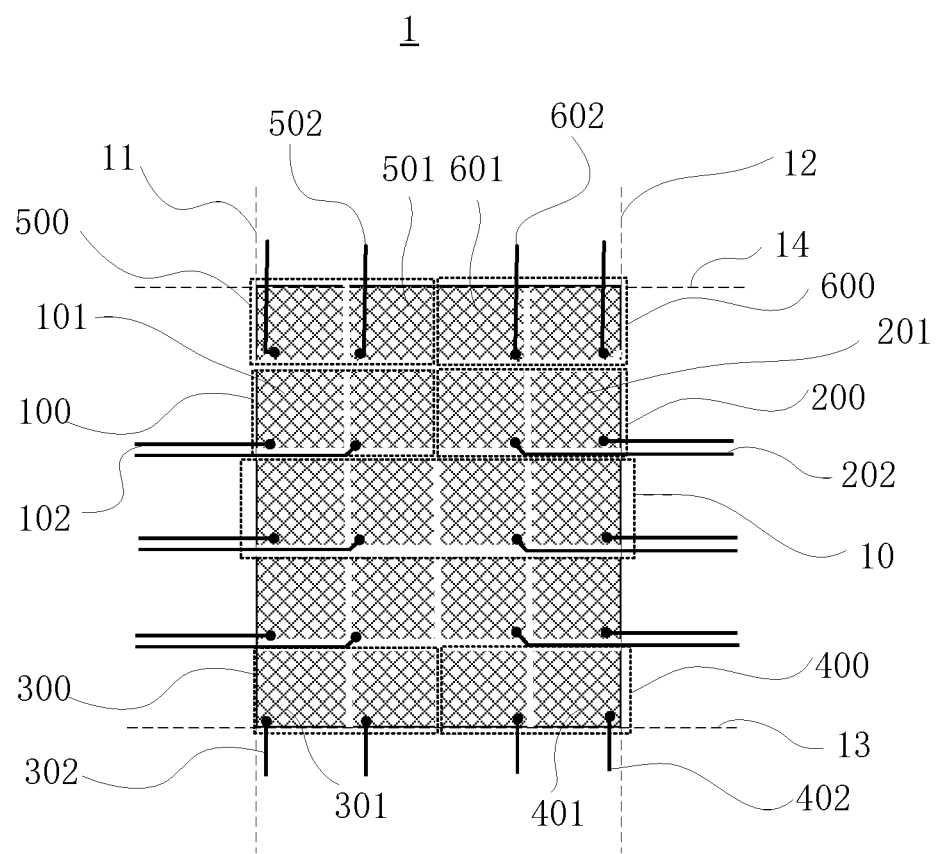
FIG. 3 is a schematic structural view of yet another embodiment of the touch module provided by the embodiment of the present invention.
Figure 4:
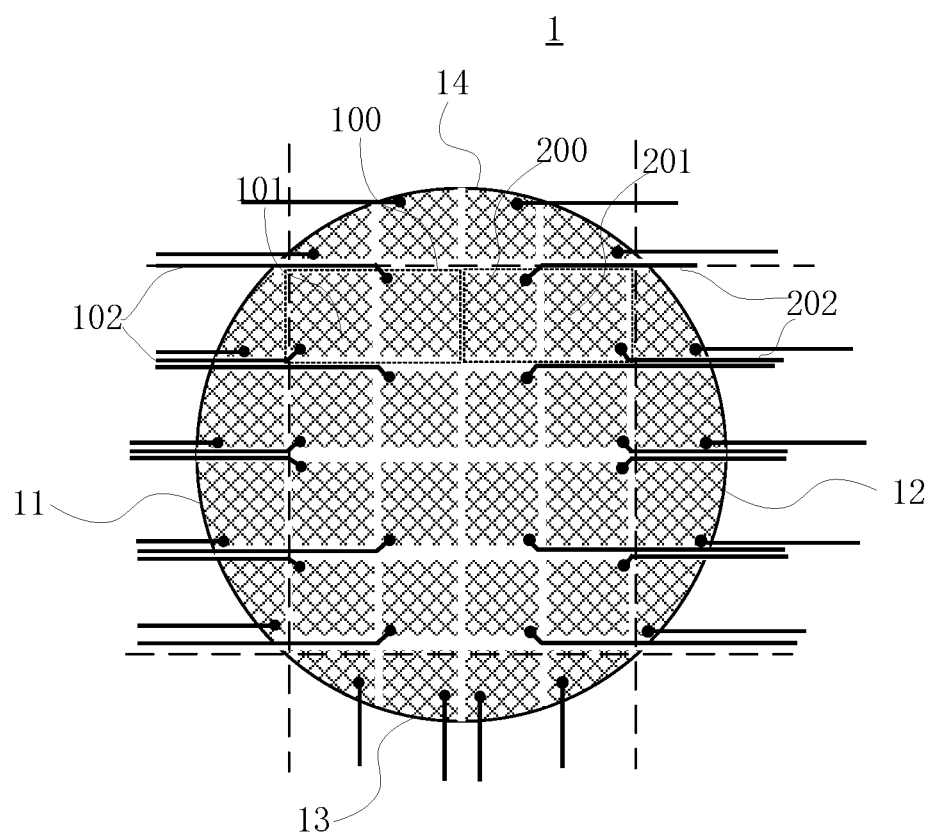
FIG. 4 is a schematic structural view of still another embodiment of the touch module provided by the embodiment of the present invention.
Figure 5:
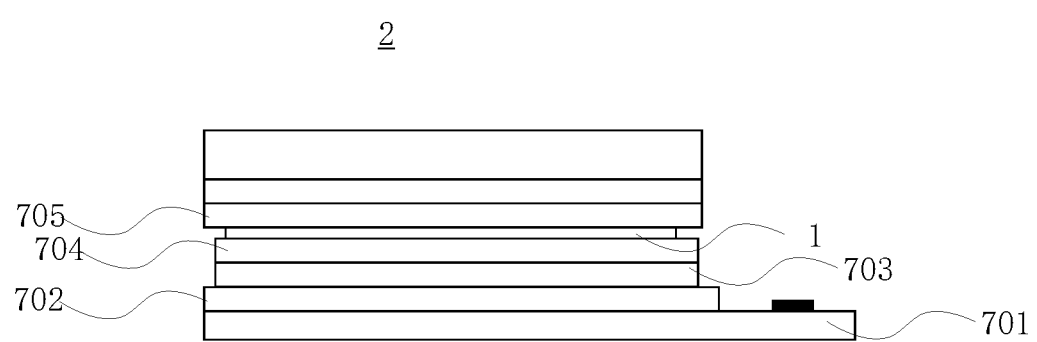
FIG. 5 is a schematic structural view of an embodiment of a touch display screen provided by the embodiment of the present invention.
Figure 6:
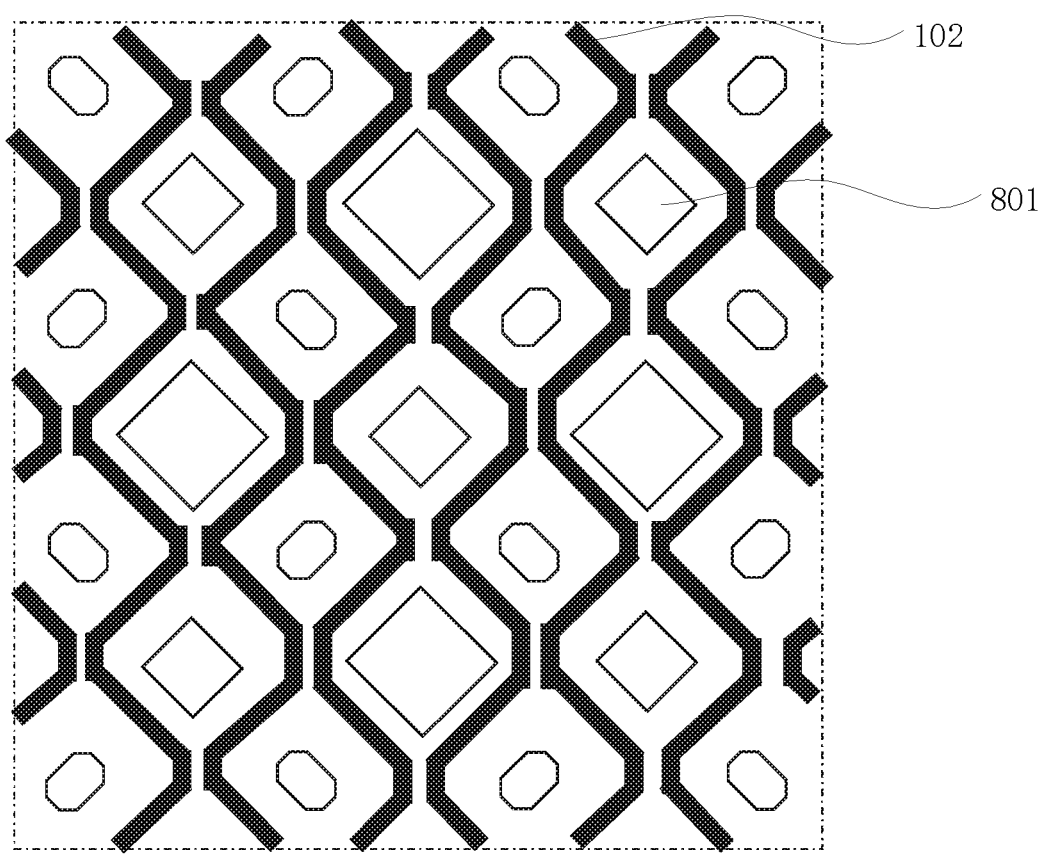
FIG. 6 is a schematic structural view of still another embodiment of the touch module provided by the embodiment of the present invention.
Figure 7:
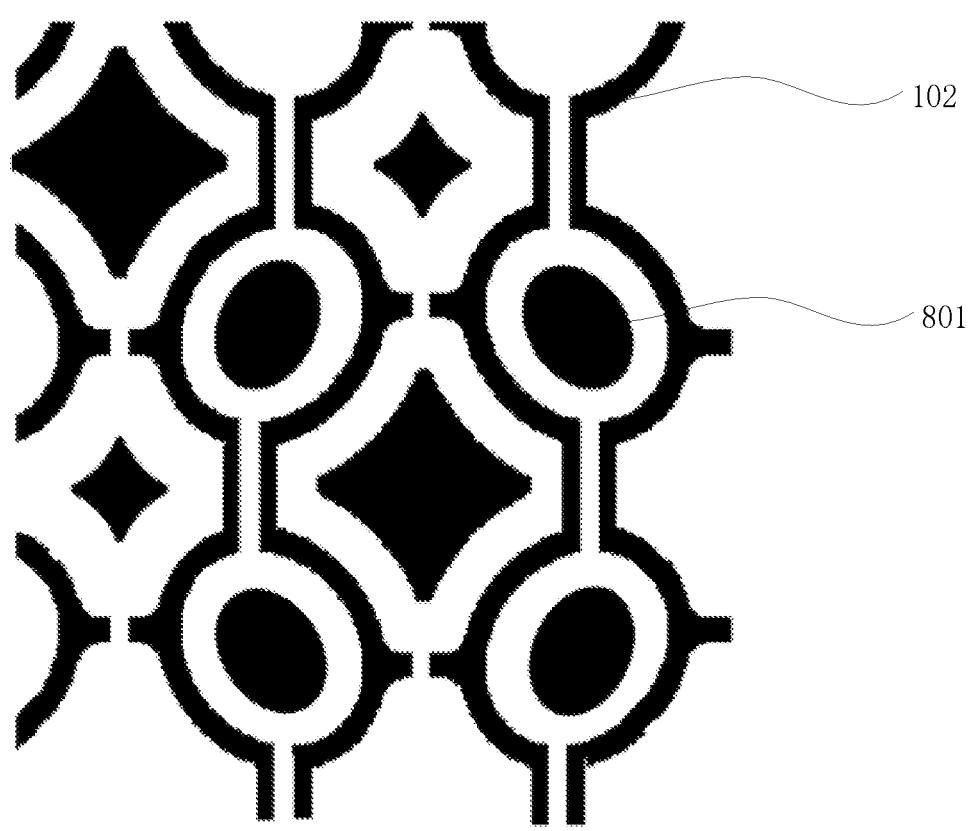
FIG. 7 is a schematic structural view of still another embodiment of the touch module provided by the embodiment of the present invention.

Please refer to FIG. 1 to FIG. 7. FIG. 1 is a schematic structural view of an embodiment of a touch module provided by an embodiment of the present invention. FIG. 2 is a schematic structural view of another embodiment of the touch module provided by the embodiment of the present invention. FIG. 3 is a schematic structural view of yet another embodiment of the touch module provided by the embodiment of the present invention. FIG. 4 is a schematic structural view of still another embodiment of the touch module provided by the embodiment of the present invention. FIG. 5 is a schematic structural view of an embodiment of a touch display screen provided by the embodiment of the present invention. FIG. 6 is a schematic structural view of still another embodiment of the touch module provided by the embodiment of the present invention. FIG. 7 is a schematic structural view of still another embodiment of the touch module provided by the embodiment of the present invention.

As shown in FIG. 1, in the embodiment of the present invention, the touch display screen comprises a touch module 1. The touch module 1 comprises a plurality of rows of electrode assemblies 10 disposed side by side, and a first side 11 and a second side 12 disposed opposite to each other. At least one row of the electrode assemblies 10 comprises a first sub-electrode group 100 and a second sub-electrode group 200 distributed in sequence along a direction from the first side 11 to the second side 12. The first sub-electrode group 100 comprises a plurality of first self-capacitance electrodes 101 and a plurality of first conductive lines 102 electrically connected to the plurality of first self-capacitance electrodes 101 in a one-to-one correspondence, and the first conductive lines 102 extend to the first side 11. The second sub-electrode group 200 comprises a plurality of second self-capacitance electrodes 201 and a plurality of second conductive lines 202 electrically connected to the plurality of second self-capacitance electrodes 201 in a one-to-one correspondence, and the second conductive lines 202 extend to the second side 12.

It should be noted that the plurality of rows of electrode assemblies 10 disposed side by side means that the plurality of rows of electrode assemblies 10 are disposed on a plane from top to bottom, instead of being arranged from left to right. At least one row of electrode assemblies 10 may be one row of electrode assemblies 10, two rows of electrode assemblies 10, or two or more rows of electrode assemblies 10, for example, two rows of electrode assemblies 10 or eight rows of electrode assemblies 10. The first side 11 can be left, upper, right, or lower, and the second side 12 is opposite to the first side 11. That is, when the first side 11 is a left side, the second side 12 is a right side. Similarly, when the first side 11 is an upper side, then the second side 12 is a lower side.

The first sub-electrode group 100 and the second sub-electrode group 200 distributed in sequence along the direction from the first side 11 to the second side 12, it can be understood that in a certain row of electrode assemblies 10, based on a certain self-capacitance electrode, all the self-capacitance electrodes in the row are divided into the first sub-electrode group 100 and the second sub-electrode group 200. Specifically, when the certain self-capacitance electrode is the first self-capacitance electrode 101 in a first row of electrode assemblies 10 and along the direction from the first side 11 to the second side 12, a second to the last self-capacitance electrode is the second self-capacitance electrode 201. At this time, a distance of a blind region corresponding to the first conductive lines 102 can be reduced by a width of one conductive line compared to a distance of a blind region corresponding to a conventional technology. Similarly, when all the first self-capacitance electrodes 101 in the first sub-electrode group 100 and all the second self-capacitance electrodes 201 in the second sub-electrode group 200 have a same number, compared with the distance of the blind region corresponding to the conventional technology, the distance of the blind region corresponding to the first conductive lines 102 can be reduced by half of a distance of a width of a whole conductive line.

Since each self-capacitance electrode in a traditional self-capacitance touch structure needs to be connected to a touch detection chip through a separate conductive line, in order to achieve a narrow frame and simplify a number of layers, conductive lines in lead wires and the self-capacitance electrodes are disposed in a same layer, and the conductive lines are routed from an inside of a touch panel, which causes a wiring region to be concentrated, thereby forming a blind region and reducing touch performance of a touch region corresponding to the blind region. In the embodiment of the present invention, in addition to the electrode assemblies 10, the touch module 1 may further comprise connecting terminals and peripheral wiring. By extending the first conductive line 102 to the first side 11 and the second conductive line 202 to the second side 12, it can be specifically understood as a distribution direction of the first conductive line 102 and the second conductive line 202, and then through the connecting terminal, the first conductive line 102 extending from the first side 11 is connected to the peripheral wiring of the first side 11, and the second conductive line 202 extending from the second side 12 is connected to the peripheral wiring of the second side 12.

The touch display screen in the present invention comprises the touch module 1. The touch module 1 comprises the plurality of rows of electrode assemblies 10 disposed side by side, and the first side 11 and the second side 12 disposed opposite to each other. The at least one row of the electrode assemblies 10 comprises the first sub-electrode group 100 and the second sub-electrode group 200 distributed in sequence along the direction from the first side 11 to the second side 12. The first sub-electrode group 100 comprises the plurality of first self-capacitance electrodes 101 and the plurality of first conductive lines 102 electrically connected to the plurality of first self-capacitance electrodes 101 in a one-to-one correspondence. The second sub-electrode group 200 comprises the plurality of second self-capacitance electrodes 201 and the plurality of second conductive lines 202 electrically connected to the plurality of second self-capacitance electrodes 201 in a one-to-one correspondence. By extending the first conductive lines 102 to the first side 11 and the second conductive lines 202 to the second side 12, the first conductive lines 102 and the second conductive lines 202 corresponding to the first self-capacitance electrode 101 and the second self-capacitance electrode 201 in the touch module 1 can be changed from a traditional vertical arrangement to a horizontal arrangement. Meanwhile, conductive lines on two sides are led out from opposite sides, which can increase a common area of the first conductive lines 102 and the second conductive lines 202, reduce an overall area occupied by the first conductive lines 102 and the second conductive lines 202, thereby reducing a blind region of a touch screen and enhancing touch performance of the touch display screen.

In the description of the present invention, it is to be understood that the terms "center," "longitudinal," "lateral," "length," "width," "thickness," "upper," "lower," "front,"

"rear," "left," "right," "vertical," "horizontal," "top," "bottom," "inner," "outer," "clockwise," "counterclockwise," and the like are used in the orientations and positional relationships indicated in the drawings for convenience in describing the present invention and for simplicity in description, and are not intended to indicate or imply that the referenced devices or elements must have a particular orientation, be constructed in a particular orientation, and be operated in a particular manner, and are not to be construed as limiting the present invention.

Furthermore, the terms "first" and "second" are used for descriptive purposes only and are not to be construed as indicating or implying relative importance or implicitly indicating the number of technical features indicated. Thus, features defined as "first", "second", may explicitly or implicitly include one or more of the described features. In the description of the present application, "plurality" means two or more unless specifically limited otherwise.

In the embodiment of the present invention, the touch module 1 further comprises a third side 13 located between the first side 11 and the second side 12. The third side 13 is located between the first side 11 and the second side 12. It can be understood that one end of the third side 13 is connected to one end of the first side 11, and the other end is connected to one end of the second side 12. In actual situations, the other end of the first side 11 and the other end of the second side 12 may be directly connected, or there may be other sides between the two ends. For example, in a regular hexagon, a bottom side can be the third side 13, and two ends of the bottom side are connected to the first side 11 and the second side 12 respectively. In the case, another end of the first side 11 and another end of the second side 12 are respectively connected to two ends of remaining three sides.

A row of electrode assemblies 10 close to the third side 13 and located at an edge comprises a third sub-electrode group 300 and a fourth sub-electrode group 400 distributed in sequence along the direction from the first side 11 to the second side 12. The third sub-electrode group 300 comprises a plurality of third self-capacitance electrodes 301 and a plurality of third conductive lines 302 electrically connected to the plurality of third self-capacitance electrodes 301 in a one-to-one correspondence. The fourth sub-electrode group 400 comprises a plurality of fourth self-capacitance electrodes 401 and a plurality of fourth conductive lines 402 electrically connected to the plurality of fourth self-capacitance electrodes 401 in a one-to-one correspondence.

The third conductive lines 302 extend to the third side 13, and/or the fourth conductive lines 402 extend to the third side 13.

In the embodiment of the present invention, the touch module 1 further comprises a fourth side 14 opposite to the third side 13 and located between the first side 11 and the second side 12.

A row of electrode assemblies 10 close to the fourth side 14 and located at the edge comprises a fifth sub-electrode group 500 and a sixth sub-electrode group 600 distributed in sequence along the direction from the first side 11 to the second side 12. The fifth sub-electrode group 500 comprises a plurality of fifth self-capacitance electrodes 501 and a plurality of fifth conductive lines 502 electrically connected to the plurality of fifth self-capacitance electrodes 501 in a one-to-one correspondence. The sixth sub-electrode group 600 comprises a plurality of sixth self-capacitance electrodes 601 and a plurality of sixth conductive lines 602 electrically connected to the plurality of sixth self-capacitance electrodes 601 in a one-to-one correspondence.

The fifth conductive lines 502 extend to the fourth side 14, and/or the sixth conductive lines 602 extend to the fourth side 14.

In the embodiment of the present invention, a maximum distance between the first side 11 and the second side 12 is not greater than a maximum distance between the third side 13 and the fourth side 14.

Specifically, when the first side 11, the second side 12, the third side 13, and the fourth side 14 are all straight lines, the maximum distance between the first side 11 and the second side 12 being not greater than the maximum distance between the third side 13 and the fourth side 14 comprises two cases. A first case is that the maximum distance between the first side 11 and the second side 12 is equal to the maximum distance between the third side 13 and the fourth side 14. At this time, the first side 11, the second side 12, the third side 13, and the fourth side 14 form a square or rhombus. A second case is that the maximum distance between the first side 11 and the second side 12 is less than the maximum distance between the third side 13 and the fourth side 14. At this time, the first side 11, the second side 12, the third side 13, and the fourth side 14 form a parallelogram or rectangle.

Specifically, when the first side 11, the second side 12, the third side 13, and the fourth side 14 are all arcs, the maximum distance between the first side 11 and the second side 12 being not greater than the maximum distance between the third side 13 and the fourth side 14 also comprises two cases (as shown in FIG. 4). A first case is that the maximum distance between the first side 11 and the second side 12 is equal to the maximum distance between the third side 13 and the fourth side 14. At this time, the first side 11, the second side 12, the third side 13, and the fourth side 14 form a circle. A second case is that the maximum distance between the first side 11 and the second side 12 is less than the maximum distance between the third side 13 and the fourth side 14. At this time, the first side 11, the second side 12, the third side 13, and the fourth side 14 form an oval shape. In summary, graphics formed by each frame in the present invention correspond to a frame corresponding to a product. Therefore, in the present invention, by extending the first conductive lines 102 to the first side 11 and the second conductive lines 202 to the second side 12, the first conductive lines 102 and the second conductive lines 202 corresponding to the first self-capacitance electrode 101 and the second self-capacitance electrode 201 in the touch module 1 can be changed from the traditional vertical arrangement to the horizontal arrangement. Meanwhile, the conductive lines on the two sides are led out from the opposite sides, which can increase the common area of the first conductive lines 102 and the second conductive lines 202, reduce the overall area occupied by the first conductive lines 102 and the second conductive lines 202, thereby reducing the blind region of the touch screen and enhancing touch performance of the touch display screen. It is also suitable for various frame shapes, thereby improving diversity and compatibility of an appearance structure of the touch display screen.

As shown in FIG. 4, in the embodiment of the present invention, at least two first conductive lines 102 are respectively disposed on two sides of the first sub-electrode group 100. One of the at least two first conductive lines 102 is connected to an upper end of the first self-capacitance electrode 101, the other first conductive line 102 is connected to a lower end of the first self-capacitance electrode 101, and different first conductive lines 102 are connected to different first self-capacitance electrodes 101. By locating the at least two first conductive lines 102 on the two sides of the first sub-electrode group 100, a width of different blind regions can be further adjusted, so that appropriate adjustments can be made according to different functional regions in the touch display screen, thereby expanding the touch performance of the entire touch display screen.

In the embodiment of the present invention, at least two second conductive lines 202 are respectively disposed on two sides of the second sub-electrode group 200. One of the at least two second conductive lines 202 is connected to an upper end of the second self-capacitance electrode 201, the other second conductive line 202 is connected to a lower end of the second self-capacitance electrode 201, and different second conductive lines 202 are connected to different second self-capacitance electrodes 201.

In the embodiment of the present invention, the first self-capacitance electrode 101 and the second self-capacitance electrode 201 are in a same film layer and are independent from each other.

In the embodiment of the present invention, the first conductive line 102 and the first self-capacitance electrode 101 are provided in a same layer, and/or the second conductive line 202 and the second self-capacitance electrode 201 are provided in a same layer.

In the present invention, the term "exemplary" is used to mean "used as an example, illustration, or illustration." Any embodiment described as "exemplary" in the present invention is not necessarily to be construed as more preferred or advantageous than other embodiments. In order to enable any person skilled in the art to implement and use the present invention, the following description is given. In the following description, the invention sets out details for the purpose of explanation. It should be understood that those of ordinary skill in the art may recognize that the present invention can be implemented even without using these specific details. In other examples, well-known structures and processes will not be elaborated in detail to avoid unnecessary details that obscure the description of the present invention. Therefore, the present invention is not intended to be limited to the illustrated embodiments, but should be consistent with the widest scope consistent with the principles and features disclosed in the present invention.

As shown in FIG. 5, in the embodiment of the present invention, a display module 2 is further comprised. The display module 2 comprises:

a base substrate 701, wherein the base substrate can be a rigid substrate or a flexible substrate; the rigid substrate can be made of metal, glass, polymer composite materials, and the flexible substrate can be made of polyimide or other flexible materials;

an array substrate 702 disposed on the base substrate;

a light-emitting device layer 703 disposed on the array substrate 702; and an encapsulation layer 704 disposed on the light-emitting device layer 703;

wherein the touch module 1 is disposed on the encapsulation layer 704.

With reference to FIG. 5 to FIG. 7, in the embodiment of the present invention, the light-emitting device layer 703 comprises a light-emitting layer, and the light-emitting layer comprises a plurality of sub-pixels 801.

At least two of the first conductive lines 102 are disposed in an interval between two adjacent sub-pixels 801 in a same row, and/or at least two of the second conductive lines 202 are disposed in the interval between two adjacent sub-pixels 801 in the same row.

For example, between adjacent red sub-pixels (large quadrilateral in FIG. 6) and blue sub-pixels (small quadrilateral in FIG. 6) or two adjacent green sub-pixels (small quadrilateral in FIG. 6), there are two first conductive lines or second conductive lines, which further reduce the occupied area, thereby effectively reducing an area of the blind region occupied by touch conductive lines in a self-capacitive touch electrode of a single-layer.

In the embodiment of the present invention, a shape of the first conductive line and/or the second conductive line can be adjusted according to the sub-pixels. For example, when the sub-pixel is elliptical, the first conductive line and/or the second conductive line are arc-shaped. As a result, a fit between the first conductive line and/or the second conductive line and the sub-pixels can be effectively increased, thereby effectively reducing the area of blind region and enhancing the touch performance of the touch screen.

In the embodiment of the present invention, it further comprises peripheral wires (not shown in the figure) located at a frame of the touch display screen and connected to each of the first conductive lines 102 and the second conductive lines 202 in a one-to-one correspondence. The peripheral wires are distributed around the touch module 1, and specific wire patterns can be designed according to frame shapes of different products. For example, when a product is a round touch display watch, a frame of the watch is round, and one side of the watch is arc-shaped. At this time, the peripheral wires can be designed to fit an arc-shape of the frame.

In order to better implement the touch display screen in the embodiment of the present invention, on the basis of the touch display screen, the embodiment of the present invention further provides a display device. As shown in FIG. 5, the display device comprises a polarizer 705 and the touch display screen provided by any of the above embodiments, and the polarizer is disposed on the touch module 1.

The display device can be any product or component with display function such as liquid crystal panel, electronic paper, OLED panel, mobile phone, tablet, television, monitor, notebook, digital photo frame, navigator, etc.

In the embodiment of the present invention, the display device further comprises a touch display integrated chip. The touch display integrated chip is connected to the first self-capacitance electrode and the second self-capacitance electrode in the touch module; and/or the touch display integrated chip is electrically connected to the display module 2.

The touch display integrated chip can be disposed on the base substrate.

The above describes the touch display screen and the display device thereof provided by the embodiments of the present invention in detail. The article uses specific examples to explain principles and implementation of the present invention. The descriptions of the above embodiments are only used to help understand technical solutions and core ideas of the present invention. Meanwhile, for those skilled in the art, according to the idea of the present invention, there will be changes in the specific implementation and application scope. In summary, contents of the manual should not be construed as a limitation on the present invention.

What is claimed is:

1. A touch display screen, comprising:
   a touch module comprising:
      a plurality of rows of electrode assemblies disposed side by side; and
      a first side and a second side disposed opposite to each other;

wherein at least one row of the electrode assemblies comprises a first sub-electrode group and a second sub-electrode group distributed in sequence along a direction from the first side to the second side, wherein the first sub-electrode group comprises a plurality of first self-capacitance electrodes and a plurality of first conductive lines electrically connected to the plurality of first self-capacitance electrodes in a one-to-one correspondence, and the first conductive lines extend to the first side, wherein the second sub-electrode group comprises a plurality of second self-capacitance electrodes and a plurality of second conductive lines electrically connected to the plurality of second self-capacitance electrodes in a one-to-one correspondence, and the second conductive lines extend to the second side, and wherein at least two of the first conductive lines are respectively disposed on two sides of the first sub-electrode group, one of the at least two first conductive lines is connected to an upper end of the first self-capacitance electrodes, another one of the at least two first conductive lines is connected to a lower end of the first self-capacitance electrodes, and different ones of first conductive lines are connected to different ones of the first self-capacitance electrodes.

2. The touch display screen as claimed in claim 1, wherein at least two of the second conductive lines are respectively disposed on two sides of the second sub-electrode group, one of the at least two second conductive lines is connected to an upper end of the second self-capacitance electrodes, another one of the at least two second conductive lines is connected to a lower end of the second self-capacitance electrodes, and different ones of the second conductive lines are connected to different ones of the second self-capacitance electrodes.

3. The touch display screen as claimed in claim 1, wherein the first self-capacitance electrodes and the second self-capacitance electrodes are in a same film layer and are independent from each other.

4. The touch display screen as claimed in claim 1, wherein the first conductive lines and the first self-capacitance electrodes are provided in a same layer, and/or the second conductive lines and the second self-capacitance electrodes are provided in a same layer.

5. The touch display screen as claimed in claim 1, further comprising peripheral wires located at a frame of the touch display screen and connected to each of the first conductive lines and the second conductive lines in a one-to-one correspondence.

6. The touch display screen as claimed in claim 1, wherein the touch module further comprises a third side located between the first side and the second side;
a row of electrode assemblies close to the third side and located at an edge comprises a third sub-electrode group and a fourth sub-electrode group distributed in sequence along the direction from the first side to the second side, wherein the third sub-electrode group comprises a plurality of third self-capacitance electrodes and a plurality of third conductive lines electrically connected to the plurality of third self-capacitance electrodes in a one-to-one correspondence, wherein the fourth sub-electrode group comprises a plurality of fourth self-capacitance electrodes and a plurality of fourth conductive lines electrically connected to the plurality of fourth self-capacitance electrodes in a one-to-one correspondence; and
the third conductive lines extend to the third side, and/or the fourth conductive lines extend to the third side.

7. The touch display screen as claimed in claim 6, wherein the touch module further comprises a fourth side opposite to the third side and located between the first side and the second side;
a row of electrode assemblies close to the fourth side and located at the edge comprises a fifth sub-electrode group and a sixth sub-electrode group distributed in sequence along the direction from the first side to the second side, wherein the fifth sub-electrode group comprises a plurality of fifth self-capacitance electrodes and a plurality of fifth conductive lines electrically connected to the plurality of fifth self-capacitance electrodes in a one-to-one correspondence, wherein the sixth sub-electrode group comprises a plurality of sixth self-capacitance electrodes and a plurality of sixth conductive lines electrically connected to the plurality of sixth self-capacitance electrodes in a one-to-one correspondence; and
the fifth conductive lines extend to the fourth side, and/or the sixth conductive lines extend to the fourth side.

8. The touch display screen as claimed in claim 7, wherein a maximum distance between the first side and the second side is not greater than a maximum distance between the third side and the fourth side.

9. The touch display screen as claimed in claim 1, further comprising a display module, wherein the display module comprises:
a base substrate;
an array substrate disposed on the base substrate;
a light-emitting device layer disposed on the array substrate; and
an encapsulation layer disposed on the light-emitting device layer;
wherein the touch module is disposed on the encapsulation layer.

10. The touch display screen as claimed in claim 9, wherein the light-emitting device layer comprises a light-emitting layer, and the light-emitting layer comprises a plurality of sub-pixels; and
at least two of the first conductive lines are disposed in an interval between two adjacent sub- pixels in a same row, and/or at least two of the second conductive lines are disposed in the interval between two adjacent sub-pixels in the same row.

11. A display device, comprising:
a polarizer; and
a touch display screen, wherein the touch display screen comprises comprising a touch module, wherein the touch module comprises:
a plurality of rows of electrode assemblies disposed side by side; and
a first side and a second side disposed opposite to each other;
wherein at least one row of the electrode assemblies comprises a first sub-electrode group and a second sub-electrode group distributed in sequence along a direction from the first side to the second side, wherein the first sub-electrode group comprises a plurality of first self- capacitance electrodes and a plurality of first conductive lines electrically connected to the plurality of first self-capacitance electrodes in a one-to-one correspondence, and the first conductive lines extend to the first side, wherein the second sub-electrode group comprises a plurality of second self-capacitance electrodes and a plurality of second conductive lines electrically connected to the plurality of second self-capacitance electrodes in a one-to-one correspondence, and the second conductive lines extend to the second side, wherein the polarizer is disposed on the touch module, and wherein at least two of the first conductive lines are respectively disposed on two sides of the first sub-electrode group, one of the at least two first conductive lines is connected to an upper end of the first self-capacitance electrodes, another one of the at least two first conductive lines is connected to a lower end of the first self-capacitance electrodes, and different ones of the first conductive lines are connected to different ones of the first self-capacitance electrodes.

12. The display device as claimed in claim 11, wherein at least two of the second conductive lines are respectively disposed on two sides of the second sub-electrode group, one of the at least two second conductive lines is connected to an upper end of the second self-capacitance electrodes, another end of the at least two second conductive lines is connected to a lower end of the second self-capacitance electrodes, and different ones of the second conductive lines are connected to different ones of the second self-capacitance electrodes.

13. The display device as claimed in claim 11, wherein the first conductive lines and the first self-capacitance electrodes are provided in a same layer, and/or the second conductive lines and the second self-capacitance electrodes are provided in a same layer.

14. The display device as claimed in claim 11, wherein the touch module further comprises a third side located between the first side and the second side;
a row of electrode assemblies close to the third side and located at an edge comprises a third sub-electrode group and a fourth sub-electrode group distributed in sequence along the direction from the first side to the second side, wherein the third sub-electrode group comprises a plurality of third self-capacitance electrodes and a plurality of third conductive lines electrically connected to the plurality of third self-capacitance electrodes in a one-to-one correspondence, wherein the fourth sub-electrode group comprises a plurality of fourth self-capacitance electrodes and a plurality of fourth conductive lines electrically connected to the plurality of fourth self-capacitance electrodes in a one-to-one correspondence; and
the third conductive lines extend to the third side, and/or the fourth conductive lines extend to the third side.

15. The display device as claimed in claim 14, wherein the touch module further comprises a fourth side opposite to the third side and located between the first side and the second side;
a row of electrode assemblies close to the fourth side and located at the edge comprises a fifth sub-electrode group and a sixth sub-electrode group distributed in sequence along the direction from the first side to the second side, wherein the fifth sub-electrode group comprises a plurality of fifth self-capacitance electrodes and a plurality of fifth conductive lines electrically connected to the plurality of fifth self-capacitance electrodes in a one-to-one correspondence, wherein the sixth sub-electrode group comprises a plurality of sixth self-capacitance electrodes and a plurality of sixth conductive lines electrically connected to the plurality of sixth self-capacitance electrodes in a one-to-one correspondence; and
the fifth conductive lines extend to the fourth side, and/or the sixth conductive lines extend to the fourth side.

16. The display device as claimed in claim 15, wherein a maximum distance between the first side and the second side is not greater than a maximum distance between the third side and the fourth side.

17. The display device as claimed in claim 11, further comprising a display module, wherein the display module comprises:
a base substrate;
an array substrate disposed on the base substrate;
a light-emitting device layer disposed on the array substrate; and
an encapsulation layer disposed on the light-emitting device layer;
wherein the touch module is disposed on the encapsulation layer.

18. The display device as claimed in claim 17, further comprising a touch display integrated chip, wherein the touch display integrated chip is connected to the first self-capacitance electrodes and the second self-capacitance electrodes in the touch module, and/or the touch display integrated chip is electrically connected to the display module.

* * * * *